United States Patent [19]
Pirker

[11] Patent Number: 5,931,518
[45] Date of Patent: Aug. 3, 1999

[54] GRIPPER FOR WAFER-SHAPED ARTICLES

[75] Inventor: Willibald Pirker, Bad Bleiberg, Austria

[73] Assignee: SEZ Semiconductor- Equipment Zubehor fur die Halbleiterfertigung AG, Villach, Austria

[21] Appl. No.: 09/093,187

[22] Filed: Jun. 8, 1998

[30] Foreign Application Priority Data

Jun. 18, 1997 [AT] Austria ..................................... 1061/97

[51] Int. Cl.⁶ .................................................. B25J 15/10
[52] U.S. Cl. .......................... 294/119.1; 294/88; 414/941
[58] Field of Search ............... 294/34, 88, 99.1, 294/100, 94, 116; 414/941; 901/37, 39; 269/34, 107, 153, 234

[56] References Cited

U.S. PATENT DOCUMENTS

| | | | |
|---|---|---|---|
| 3,170,322 | 2/1965 | Cavanaugh | 294/119.1 |
| 4,453,757 | 6/1984 | Soraoka | 294/119.1 |
| 4,705,313 | 11/1987 | Radice | 294/119.1 |
| 4,861,086 | 8/1989 | Toral | 294/119.1 |
| 4,903,717 | 2/1990 | Sumnitsch | |
| 5,125,708 | 6/1992 | Borcea et al. | 294/119.1 |
| 5,513,668 | 5/1996 | Sumnitsch | |
| 5,520,501 | 5/1996 | Kouno et al. | 901/37 |
| 5,762,391 | 6/1998 | Sumnitsch | 294/119.1 |
| 5,803,521 | 9/1998 | Zejda et al. | 294/88 |

FOREIGN PATENT DOCUMENTS

| | | |
|---|---|---|
| 92 04 457 | 7/1992 | Germany . |
| WO 95/11518 | 4/1995 | WIPO . |
| WO 97/03457 | 1/1997 | WIPO . |

*Primary Examiner*—Dean Kramer
*Attorney, Agent, or Firm*—Young & Thompson

[57] ABSTRACT

A gripper for wafer-shaped articles (silicon wafers) has several radially adjustable gripping claws (2). Gripping claws (2) are loaded by springs so that when an article is held they tightly adjoin its outer edge. To move gripping claws (2) to the outside, there is a spreading device (20) with conical spreading body (21). In addition, gripping claws (2) are coupled to one another such that they cannot move to the inside independently of one another and it is ensured that individual gripping claws (2) cannot move farther to the inside than other griping claws (2). This is achieved for example by conical spreading body (21) being loaded by spring (26) which keeps it continually against parts connected to gripping claws (2), for example, rollers (18) provided on their guide bodies (12). This reliably prevents individual gripping claws (2) from moving radially to the inside farther than other gripping claws (2). Thus the article is held by the gripper in a defined position to it.

6 Claims, 1 Drawing Sheet

GRIPPER FOR WAFER-SHAPED ARTICLES

FIELD OF THE INVENTION

The invention relates to a gripper for wafer-shaped articles with the features of the introductory part of claim 1.

BACKGROUND OF THE INVENTION

This gripper is known from WO 95/11518. In the known gripper the gripping claws are held by spring force in the position which holds the wafer-shaped article (wafer) so that the location of the wafer-shaped article (wafer) relative to the gripper is not unequivocally defined, because in the known gripper the conical spreading body no longer acts on the gripping claws as soon as the gripper holds a wafer-shaped article, therefore the gripping claws tightly adjoin the outside edge of the article. Often wafer-shaped articles (wafers) were not held centered to the gripper axis, especially when a flat or notch comes to rest on the edge of the wafer-shaped article in the area of one of the gripping claws. In this case this gripping claw cannot exert a force acting radially to the inside on the wafer-shaped article so that the gripping claw opposite it shifts the wafer-shaped articles out of the centered position under the action of the spring force loading it. For the case in which all gripping claws tightly adjoin the edge of the wafer-shaped article, when it is held with the known gripper, there are different holding positions since the spring constant of the individual springs which load the gripping claws to the inside are not exactly the same.

When wafer-shaped articles are placed on holders, for example, when silicon wafers are placed on chucks which hold the articles during further treatment steps (etching, polishing, etc.) the above described problems cause other problems in that the known gripper could place the wafer-shaped article exactly concentrically to the axis of rotation of the chuck only in exceptional cases, therefore rather randomly. For chucks which are equipped with (adjustable) pins on their surface facing the wafer-shaped article, which can move radially to the inside if necessary in order to center the wafer-shaped article (U.S. Pat. No. 5,513,668), this is not a problem since the wafer-shaped article has ultimately been centered. In chucks for wafer-shaped articles without the aforementioned pins in which the wafer-shaped articles are held exclusively or preferably by the Bernoulli principle (U.S. Pat. No. 4,903,717) or by negative pressure (WO 97/03457), for wafer-shaped articles which have not been concentrically placed, problems with unbalanced mass arise when the wafer-shaped article has been caused to rotate by the chuck during the treatment steps to be carried out.

SUMMARY OF THE INVENTION

The object of the invention is to change the construction of the known gripper such that individual gripping claws cannot move radially to the inside independently of other gripping claws.

This object is achieved with the features recited in claim 1.

Preferred and advantageous embodiments of the gripper as claimed in the invention are the subject of the subclaims.

Since in the gripper as claimed in the invention care is taken that none of the gripping claws can be shifted radially farther to the inside than other gripping claws (generally for example there are six gripping claws), wafer-shaped articles are always held concentrically to the axis of the gripper in a reproducible (defined) position and can be placed by the gripper on a chuck for wafer-shaped articles in a defined manner, for example, concentrically to the axis of the carrier.

The means which provides for the fact that the gripping claws can only jointly be shifted radially can be made as desired. Thus, for example it can be mechanical coupling of the gripping claws in the manner of lever connections or as is preferred within the framework of the invention, it is a spreading means which is provided in the known gripper (WO 95/11518) and which for example is preferably a conical spreading body which interacts with the radially inner ends of the guide rods or guide bodies of the gripping claws, and made such that it continually tightly adjoins the inner ends of the guide rods or guide bodies. This can be achieved in the simplest case by a spring being assigned to the spreading body which keeps it continually against the guide rods or guide bodies of the gripping claws or rollers provided thereon. The spreading body which is used to shift the gripping claws (radially) to the outside when the gripper opens, by virtue of its resting against the parts of the gripping claws which lie (radially) to the inside (guide rods, guide bodies or rollers provided thereon) prevents the gripping claws from being able to move independently of one another. The gripping claws can only move jointly. If one of the gripping claws, for whatever reason, acts with greater force on the spreading body than the other gripping claws, the spreading body is moved upward and the other gripping claws move to the inside due to the spring force which acts on them and likewise remain against the spreading body. Thus in the construction of the gripper as claimed in the invention it is not possible for individual gripping claws to move radially to the inside independently of the others.

BRIEF DESCRIPTION OF THE DRAWINGS

Other details and advantages of the invention result from the following description of one preferred embodiment of the invention in which reference is made to the attached drawing.

DETAILED DESCRIPTION OF THE INVENTION

Figure 1:
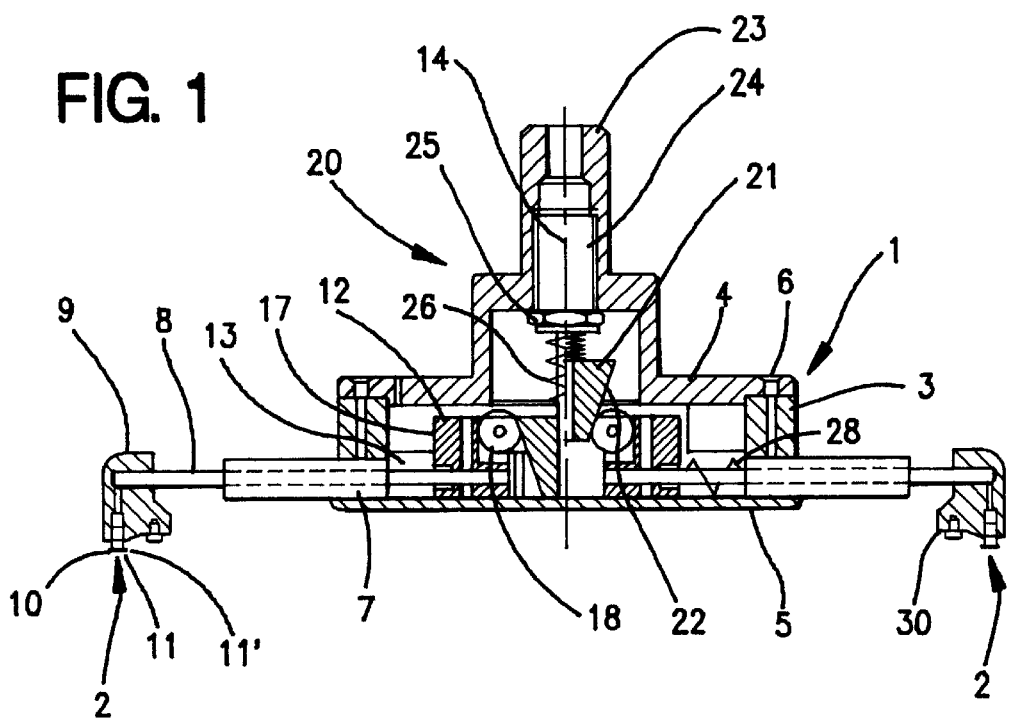
FIG. 1 shows a gripper in an axial section, on the right half of FIG. 1 the gripping claw having been shifted radially to the inside, conversely the gripping claw shown on the left in FIG. 1 is shifted radially to the outside by the spreading means.
Figure 2:
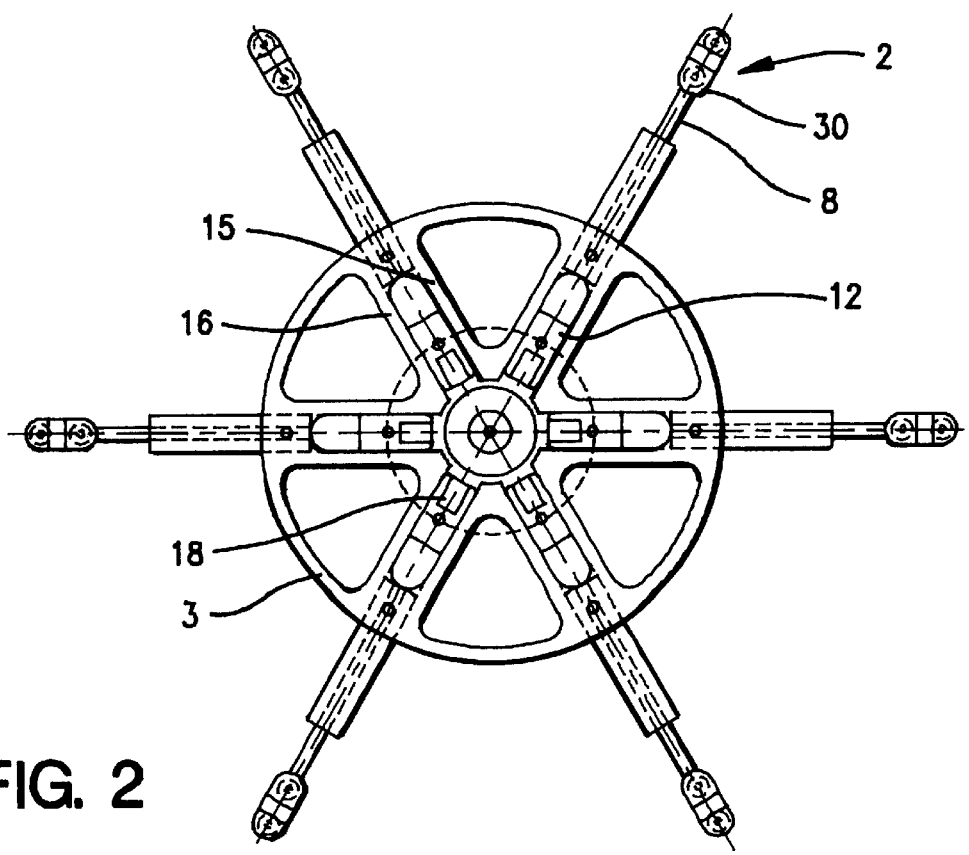
FIG. 2 shows an overhead view of the gripper (with the housing cover removed).

The gripper as claimed in the invention consists of base body 1 which has a round outline shape in the embodiment shown and of gripping claws 2 which can be shifted radially to the inside and outside relative to base body 1, in the embodiment shown, six claws.

Base body 1 has essentially cylindrical wall 3, cover 4 and base plate 5. These parts of base body 1 are joined to one another by screws 6. Base plate 5 can also be made in one piece with wall 3.

In wall 3 of base body 1 guide sleeves 7 are inserted in which radially aligned guide rods 8 of gripping claws 2 are movably guided. On the outer ends of guide rods 8 are retaining pieces 9 on which there are pins 10 with projecting flange 11. Pins 10 are the parts of gripping claws 2 which act to grip a wafer-shaped article. The parts of guide rods 8 outside of wall 3 can be covered by expansion bellows of variable length (not shown).

Pins 10 can have a ring bounded by two conical surfaces above flange 11. Especially in this embodiment shown in FIG. 3 of WO 95/11518, shoulders 30 which are yet to be described on retaining pieces 9 can also be omitted.

There can be tongue-like shoulders 30 pointing radially to the inside on retaining bodies 9 for pins 10. These shoulders 30, more accurately the knob-like supports attached to them, are used as a support for a wafer-shaped article when base plate 5 of base body 1 points upward by turning of base body 1.

Guide bodies 12 which can be moved radially in guide grooves 13 are attached to the radially inner ends of guide rods 8. Guide grooves 13 for guide bodies 12 are formed by two walls 15 and 16 which run roughly radially and which are molded on base plate 5 of base body 1 projecting to the inside.

There is spreading means 20 for pressing gripping claws 2 radially to the inside from the readiness position shown on the right in FIG. 1 into which they are pressed by springs 28 (for example, helical compression springs placed above guide rods 8 or an annular helical spring or a rubber elastic band which is placed around outer surfaces 17 of guide body 12).

The aforementioned spring means which loads gripping claws 2 radially to the inside can also be pneumatic springs which act such that they load the gripping claws radially to the inside.

In the embodiment shown spreading means 20 consists of spreading body 21 with conical jacket surface 22 which acts on guide bodies 12 via rollers 18 which are supported to turn freely on guide bodies 12 and thus on gripping claws 2 via guide rods 8. To actuate spreading body 21, in one shoulder of cover part 4 of base body 1 pneumatic motor 24, preferably a pneumatic cylinder, is accommodated, with a piston rod 25 which is joined to spreading body 21.

If with the gripper as claimed in the invention a wafer-shaped article which lies on a surface, for example a silicon wafer, is to be held, first of all pneumatic cylinder 24 is actuated to move spreading body 21 down until it touches the inside of base plate 5 (left side of FIG. 1). Now gripping claws 2 are in their radially outermost position. At this point the gripper is moved by hand or via a robot into a position in which pins 10 on gripping claws 2 are located next to the outside periphery of the article to be held. As soon as this has happened, spreading body 21 is moved upward so that pins 10 come into contact with the outer periphery of the wafer-shaped article.

Gripping also takes place reliably when the article rests superficially on a base, since flange 11 in the free ends of gripping pins 10 have upper boundary surfaces 11' which point obliquely upward (in the form of conical jackets). When pins 10 move to the inside the wafer-shaped article is lifted since it slides upwards over oblique surfaces 11' until pins 10 tightly adjoin the outside periphery of the article.

If the wafer-shaped article, as is the case in a silicon wafer, is an article which is not exactly round, some of gripping claws 2 will not tightly adjoin the outside periphery of the article.

In the gripper as claimed in the invention, spreading means 20, regardless of the embodiment it has, is made such that it is used not only to move gripping claws 2 (radially) to the outside before a wafer-shaped article is held, but it is also used to prevent individual gripping claws 2, as is also possible in the gripper known from WO 95/11518, from moving farther (radially) to the inside than other gripping claws 2.

In the embodiment shown, this is done by assigning not only pneumatic motor 24, but also spring 26, to spreading body 21 of spreading means 20. When pneumatic motor 24 is unpressurized, spring 26 holds spreading body 21 furthermore against gripping claws 2. Here it is irrelevant whether spreading body 21, as in the embodiment shown, tightly adjoins rollers 18 of gripping claws 2, guide bodies 12 of guide rods 8, guide rods 8 or any other parts connected to gripping claws 2.

Spring 26 which loads spreading body 21 can, as shown in the embodiment, be a helical compression spring. But it is also possible to provide another spring, for example a pneumatic spring, which keeps spreading body 21 against gripping claws 2 or parts connected to it, for example rollers 18. An embodiment is also conceivable in which pneumatic motor 24, which is for example a pneumatic cylinder which actuates spreading body 21, is used as a pneumatic spring by applying the correspondingly low pressure to it.

It is important that the spring force, which acts on spreading body 21 to hold the latter against gripping claws 2 or parts connected to it, is not so great that spring 26 assigned to spreading body 21 exerts such great forces on gripping claws 2 that gripping claws 2 under the action of the springs which load them to the inside and which are assigned to them are no longer moved to the inside, since otherwise secure gripping of a wafer-shaped article with the gripper would no longer be possible.

By means of the design of the gripper as claimed in the invention in which gripping claws 2 in the embodiment shown are coupled to one another by spreading means 20 assigned to them with conical spreading body 21, so that individual gripping claws 2 cannot move (radially) to the inside farther than other gripping claws 2, it is ensured that a wafer-shaped article is always held in a definable, reproducible position to the gripper, especially concentrically to axis 14 of the gripper, even if the wafer-shaped article has an outline which deviates from an exact circular shape.

In summary, one preferred embodiment of the invention can be described as follows:

A gripper for wafer-shaped articles (silicon wafers) has several radially adjustable gripping claws 2. Gripping claws 2 are loaded by springs so that when an article is held they tightly adjoin its outer edge.

To move gripping claws 2 to the outside, there is spreading means 20 with conical spreading body 21. In addition, gripping claws 2 are coupled to one another such that they cannot move to the inside independently of one another and it is ensured that individual gripping claws 2 cannot move farther to the inside than other gripping claws 2. This is achieved for example by conical spreading body 21 being loaded by spring 26 which keeps it continually against parts connected to gripping claws 2, for example rollers 18 provided on their guide bodies 12. This reliably prevents individual gripping claws 2 from moving radially to the inside farther than other gripping claws 2. Thus the article is held by the gripper in a defined position to it.

I claim:

1. Gripper for semiconductor wafers and other wafer-shaped articles having an outer periphery that is at least approximately circular, the gripper comprising:

a base body;

a plurality of gripping claws movably disposed on the base body, said gripping claws adapted to move radially inward and outward relative to the base body;

elastic means for urging the gripping claws radially inward toward the base body; and spreading means for urging the gripping claws radially outward against the urging of the elastic means, said spreading means comprising a spreading body which is capable of moving along an axis perpendicular to directions of movement of the gripping claws; said spreading body having a conical jacket surface structured and arranged to act on the gripping claws and prevent movement of individual gripping claws further radially inward than any other of the gripping claws; said spreading body being held by spring means such that the conical jacket surface abuts the gripping claws; and wherein the spring means exerts a smaller force component acting in the direction of movement of the gripping claws than forces exerted by the elastic means urging the gripping claws radially inward toward the base body.

2. The gripper according to claim 1, wherein the conical jacket surface of the spreading body is held by the spring means against parts connected to the gripping claws.

3. The gripper according to claim 1, wherein the conical jacket surface of the spreading body is held by the spring means against rollers on guide bodies for guide rods of gripping claws.

4. The gripper according to claim 1, wherein the conical jacket surface of the spreading body acts on the gripping claws indirectly via a guide body connected to a respective gripping claw.

5. The gripper according to claim 1, wherein the spring means is a helical compression spring.

6. The gripper according to claim 1, wherein the spring means comprises a drive cylinder with a piston rod.

* * * * *